US012772368B2

(12) United States Patent
Brewer

(10) Patent No.: US 12,772,368 B2
(45) Date of Patent: Oct. 20, 2026

(54) THERMAL MANAGEMENT ENHANCEMENT OF ELECTRONIC COMPONENTS

(71) Applicant: Wolfspeed, Inc., Durham, NC (US)

(72) Inventor: Kenneth P. Brewer, Mesa, AZ (US)

(73) Assignee: Wolfspeed, Inc., Durham, NC (US)

( * ) Notice: Subject to any disclaimer, the term of this patent is extended or adjusted under 35 U.S.C. 154(b) by 294 days.

(21) Appl. No.: 18/417,295

(22) Filed: Jan. 19, 2024

(65) Prior Publication Data

US 2025/0240867 A1 Jul. 24, 2025

(51) Int. Cl.
*H05K 1/02* (2006.01)
*H01F 27/24* (2006.01)

(52) U.S. Cl.
CPC ........... *H05K 1/0204* (2013.01); *H01F 27/24* (2013.01); *H05K 2201/066* (2013.01); *H05K 2201/10015* (2013.01); *H05K 2201/1003* (2013.01)

(58) Field of Classification Search
CPC ............... H01L 23/367; H01L 23/3672; H01L 23/3677; H01L 23/373; H01L 23/40; H01L 23/49575; H01L 23/49589; H01L 23/642; H01L 23/645; H01L 23/647; H01L 23/66; H01L 24/45; H01L 24/48; H01L 24/85; H01L 25/00; H01L 25/0655; H01L 25/072; H01L 25/16; H01L 25/18; H01L 2023/6611; H01L 2023/6644; H01L 2023/6655; H01L 2023/6672; H01L 2224/08225; H01L 2224/48137; H01L 2924/1421; H01L 2924/30111; H03F 3/19; H03F 3/195; H03F 3/211; H03F 3/213; H03F 3/245; H03F 3/56; H03F 3/72; H03F 1/0288; H03F 1/523; H03F 1/565; H03F 2200/222; H03F 2200/387; H03F 2200/447; H03F 2200/451; H01F 27/24; H05K 1/0201; H05K 1/0204; H05K 1/0243; H05K 1/116; H05K 1/18; H05K 1/181; H05K 1/183; H05K 2201/10015; H05K 2201/1003; H03H 2/008; H03H 7/40; H10D 1/68
See application file for complete search history.

(56) References Cited

U.S. PATENT DOCUMENTS

| | | | | |
|---|---|---|---|---|
| 11,538,751 | B2 * | 12/2022 | Peng | H10D 1/20 |
| 2004/0257187 | A1 * | 12/2004 | Drummond | H01F 30/06<br>336/61 |
| 2011/0215891 | A1 * | 9/2011 | Sundstrom | H01F 41/00<br>29/606 |
| 2016/0189847 | A1 * | 6/2016 | Willis | H01F 27/24<br>336/212 |
| 2019/0103212 | A1 * | 4/2019 | Fujii | H01F 30/10 |
| 2019/0333676 | A1 * | 10/2019 | Shin | H01F 38/14 |
| 2023/0170125 | A1 * | 6/2023 | Turvey | H01F 27/2823<br>29/606 |

(Continued)

*Primary Examiner* — Amir A Jalali
(74) *Attorney, Agent, or Firm* — Patterson + Sheridan, LLP

(57) ABSTRACT

An electronics arrangement comprises an electrically insulative substrate comprising a top side and a bottom side. The electronics arrangement further comprises an inductor, a capacitor, or both. The electronics arrangement further comprises a thermally conductive heat transfer structure operative to transfer heat away from the ferrite core, the capacitor, or both.

15 Claims, 15 Drawing Sheets

(56) References Cited

U.S. PATENT DOCUMENTS

| | | | | |
|---|---|---|---|---|
| 2023/0187113 | A1* | 6/2023 | Prager | H01F 27/24 361/760 |
| 2023/0260688 | A1* | 8/2023 | Woo | H01F 27/306 361/752 |
| 2024/0407102 | A1* | 12/2024 | Phan | H05K 1/115 |
| 2025/0037931 | A1* | 1/2025 | Nishizawa | H01F 27/40 |

* cited by examiner

THERMAL MANAGEMENT ENHANCEMENT OF ELECTRONIC COMPONENTS

BACKGROUND

Electronics generate heat when in operation. The higher the performance or power demands of electronic components, the more heat such components generally tend to generate. Heat is known to have deleterious effects on the performance and reliability of such components. Accordingly, thermal management techniques are often employed to avoid such effects.

An example of an electronic component commonly used in high performance applications includes a High Electron Mobility Transistor (HEMT). A HEMT is a type of Field Effect Transistor (FET) having a low noise figure at microwave frequencies. HEMTs may be used in Radio Frequency (RF) circuits as both digital switches and current amplifiers where high performance is required at very high frequencies. Traditional HEMTs have been fabricated with several materials, including Silicon (Si), Gallium Arsenide (GaAs), Aluminum Gallium Arsenide (AlGaAs), Gallium Nitride (GaN), and Aluminum Gallium Nitride (AlGaN).

In practical applications, GaN HEMTs are used in conjunction with a variety of circuits comprising various components such as capacitors, inductors, and resistors. In one example, a HEMT may be used in conjunction with a bias tee. A bias tee is an electronic component that is often used to provide direct current (DC) or voltage to bias RF circuits.

An example of a bias tee 100*a* is represented schematically in FIG. 1. The bias tee comprises a capacitor 110, an inductor 120, a first input port 101, a second input port 102, and an output port 103. The first input port 101 is connected to an RF input ($RF_{IN}$). The second input port 102 is connected to a DC input ($DC_{IN}$).

The capacitor 110 and inductor 120 respectively pass $RF_{IN}$ and $DC_{IN}$ through to the output port 103 to provide a biased RF output ($RF_{OUT}$+$DC_{OUT}$). The capacitor 110 restricts $DC_{IN}$ from passing to the RF input port 102. Correspondingly, the inductor 120 restricts $RF_{IN}$ from passing to the DC input port 101.

In another example of a high performance RF application, HEMTs may be employed as amplifiers in conjunction with RF filters at the amplifier input, output, or both, to optimize operation of the amplifier in desired frequency ranges, provide impedance matching to connected circuits, and the like. A particular example of such an amplifier is known as a Doherty amplifier.

An example of a Doherty amplifier 10 is represented schematically in FIG. 2. The Doherty amplifier 10 comprises a power divider 12, a phase shifter 14, input matching stages 16*a*, 16*b*, first and second transistors 18*a*, 18*b*, output matching stages 20*a*, 20*b*, an impedance inverter 22, and a transformer 24.

The power divider 12 divides an RF input signal ($RF_{IN}$) into a first signal and a second signal (e.g., using a quadrature coupler). The first transistor 18*a* operates on the first signal and is used for most signal amplification. In this regard, the first transistor 18*a* is often referred to as a "main" or "carrier" amplifier stage. The second transistor 18*b* operates on the second signal and is used to amplify signal peaks. Accordingly, the second transistor 18*b* is often referred to as an "auxiliary" or "peak" amplifier stage.

The output connection of the first and second amplifiers is made through an impedance inverter 22, often implemented using a quarter-wavelength transmission line, and often having a 90-degree phase shift. At low input signal power levels, the second amplifier is inactive and is effectively an open circuit. The system impedance is reduced at the output of the second amplifier due to an output matching network. This impedance is inverted to a much higher impedance by the impedance inverter 22, presenting a high output impedance to the first amplifier and improving its efficiency. As the second amplifier begins to amplify signal peaks, its increasing output current (summed with the output current of the first amplifier) increases the voltage across the load impedance, which the impedance inverter 22 presents to the first amplifier as a decreasing impedance. The lower impedance allows the first amplifier output power to increase as the input signal power increases. This is known as load modulation, and it results in the Doherty amplifier 10 exhibiting high efficiency across the full range of input signal power.

Other kinds of amplifiers may be used in conjunction with a bias tee 100 as well. For example, distributed amplifiers are also often used in high performance RF applications. FIG. 3 is a circuit diagram illustrating an example of a distributed amplifier 50. The distributed amplifier 50 comprises a plurality of FET-based amplifier stages 55*a-c*. Although three amplifier stages 55*a-c* are illustrated in FIG. X, other examples of distributed amplifiers 50 may include a greater or lesser number of amplifier stages 55.

The distributed amplifier 50 further comprises an input-side transmission line 52 and an output-side transmission line 54. The input-side transmission line 52 is connected to an input port 53 providing $RF_{IN}$ and connects inputs of the amplifier stages 55*a-c*, terminating with a resistor. The output-side transmission line 54 connects outputs of the amplifier stages 55*a-c* and provides $RF_{OUT}$ at an output port 56. The delay on the input and output transmission lines 52, 54 are typically matched to ensure that the output of each amplifier stage 55*a-c* sums in phase with the other amplifier stages 55*a-c* in the chain.

The distributed amplifier 50 further comprises impedance matching networks (IMNs) 58*a-h* to match the inputs and outputs of the amplifier stages 55*a-c* to a particular characteristic impedance (typically 50 ohms in microwave applications).

Although HEMTs, bias tees 100, and amplifiers are particular examples of electronic components used in high performance applications, efficient and effective thermal management is of interest to improve performance and reliability in a wide variety of applications.

The Background section of this document is provided to place embodiments of the present invention in technological and operational context, to assist those of skill in the art in understanding their scope and utility. Approaches described in the Background section could be pursued but are not necessarily approaches that have been previously conceived or pursued. Unless explicitly identified as such, no statement herein is admitted to being prior art merely by its inclusion in the Background section.

BRIEF SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present disclosure generally relate to electronics arrangements with improved thermal management capabilities relative to conventional arrangements. The electronics arrangements described herein may comprise an inductor, a capacitor, or both. The electronics arrangements described herein further comprise at least one thermally conductive heat transfer structure operative to transfer heat away from the inductor, the capacitor, or both.

In particular, one or more embodiments include an electronics arrangement comprising an electrically insulative substrate, an inductor, and a thermally conductive heat transfer structure. The electrically insulative substrate comprises a top side and a bottom side. The inductor comprises a ferrite core above the substrate and an electrically conductive wire wound around the ferrite core. The thermally conductive heat transfer structure is operative to transfer heat away from the ferrite core. The heat transfer structure comprises a thermally conductive, electrically insulating element passing through the ferrite core.

In some embodiments, the thermally conductive heat transfer structure comprises a thermally conductive material having a thermal conductivity of more than 28 W/mK.

In some embodiments, the thermally conductive heat transfer structure comprises a thermally conductive material having a thermal conductivity of more than 140 W/mK.

In some embodiments, the thermally conductive heat transfer structure comprises a thermally conductive material having a thermal conductivity of more than 300 W/mK.

In some embodiments, the thermally conductive heat transfer structure comprises an electrically insulative material having a dielectric constant of less than 10.2 F/m.

In some embodiments, the thermally conductive heat transfer structure comprises an electrically insulative material having a dielectric constant of less than 9.25 F/m.

In some embodiments, the thermally conductive heat transfer structure comprises an electrically insulative material having a dielectric constant of less than 7 F/m.

In some embodiments, the electronics arrangement further comprises first and second traces on the top side of the substrate. Each of the traces is bonded to a respective end of the wire.

In some embodiments, the electronics arrangement further comprises a heatsink contacting the substrate.

In some embodiments, the element passes adjacently through the core in a direction that is predominantly parallel to the top and bottom sides of the substrate.

In some embodiments, the element passes adjacently through the core in a direction that is predominantly perpendicular to the top and bottom sides of the substrate.

In some embodiments, the electronics arrangement further comprises a capacitor positioned within an opening in the substrate. In some such embodiments, the electronics arrangement further comprises a first input port, a second input port, and an output port. The first input port is configured to provide DC to the inductor. The second input port configured to provide an RF signal to the capacitor. The output port is connected to the inductor and the capacitor and is configured to transmit a combination of the DC and RF signal. The inductor is configured to pass the DC from the first input port and restrict the RF signal from reaching the second input port. The capacitor is configured to pass the RF signal from the second input port and restrict the DC from reaching the first input port. In some such embodiments, the electronics arrangement further comprises a Doherty amplifier or distributed amplifier electrically connected between the first input port and the inductor. The electronics arrangement may additionally or alternatively comprise an additional thermally conductive heat transfer structure operative to transfer heat away from the capacitor and toward the bottom side of the substrate. The additional heat transfer structure comprises a further thermally conductive electrically insulating element adjacent to the capacitor.

In some embodiments, the heat transfer structure further comprises one or more support structures extending through one or more openings in the substrate. To transfer the heat away from the ferrite core, the thermally conductive heat transfer structure is operative to transfer the heat toward the bottom of the substrate through the one or more openings.

In some embodiments, the thermally conductive heat transfer structure comprises Alumina.

In some embodiments, the thermally conductive heat transfer structure comprises Aluminum Nitride.

In some embodiments, the thermally conductive heat transfer structure comprises Beryllium Oxide.

Other embodiments comprise an electronics arrangement comprising an electrically insulative substrate, a capacitor, and a thermally conductive heat transfer structure. The electrically insulative substrate comprises a top side and a bottom side. The capacitor is positioned within an opening in the substrate. The thermally conductive heat transfer structure is operative to transfer heat away from the capacitor and toward the bottom side of the substrate. The heat transfer structure comprises a thermally conductive electrically insulating element adjacent to the capacitor.

In some embodiments, the thermally conductive heat transfer structure comprises a thermally conductive material having a thermal conductivity of more than 28 W/mK.

In some embodiments, the thermally conductive heat transfer structure comprises a thermally conductive material having a thermal conductivity of more than 140 W/mK.

In some embodiments, the thermally conductive heat transfer structure comprises a thermally conductive material having a thermal conductivity of more than 300 W/mK.

In some embodiments, the thermally conductive heat transfer structure comprises an electrically insulative material having a dielectric constant of less than 10.2 F/m.

In some embodiments, the thermally conductive heat transfer structure comprises an electrically insulative material having a dielectric constant of less than 9.25 F/m.

In some embodiments, the thermally conductive heat transfer structure comprises an electrically insulative material having a dielectric constant of less than 7 F/m.

In some embodiments, the electronics arrangement further comprises first and second traces on the top side of the substrate. Each of the traces is bonded to a respective connector of the capacitor.

In some embodiments, the electronics arrangement further comprises a heatsink contacting the substrate. In some such embodiments, the heat transfer structure further comprises a metallization layer bonded to the heatsink.

In some embodiments, the electronics arrangement further comprises an inductor comprising a ferrite core above the substrate and an electrically conductive wire wound around the ferrite core. In some such embodiments, the electronics arrangement further comprises a first input port, a second input port, and an output port. The first input port is configured to provide DC to the inductor. The second input port is configured to provide an RF signal to the capacitor. The output port is connected to the inductor and the capacitor and is configured to transmit a combination of the DC and RF signal. The inductor is configured to pass the DC from the first input port and restrict the RF signal from reaching the second input port. The capacitor is configured to pass the RF signal from the second input port and restrict the DC from reaching the first input port. In some such embodiments, the electronics arrangement further comprises a Doherty amplifier or distributed amplifier electrically connected between the first input port and the inductor. The electronics arrangement may additionally or alternatively comprise an additional thermally conductive heat transfer structure operative to transfer heat away from the ferrite core. The additional heat transfer structure comprises a further thermally conductive electrically insulating element passing through the core.

In some embodiments, to transfer the heat away from the capacitor, the thermally conductive heat transfer structure is operative to transfer the heat toward the bottom of the substrate through the opening.

In some embodiments, the thermally conductive heat transfer structure comprises Alumina.

In some embodiments, the thermally conductive heat transfer structure comprises Aluminum Nitride.

In some embodiments, the thermally conductive heat transfer structure comprises Beryllium Oxide.

Of course, those skilled in the art will appreciate that the present embodiments are not limited to the above contexts or examples, and will recognize additional features and advantages upon reading the following detailed description and upon viewing the accompanying drawings.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

Figure 1:
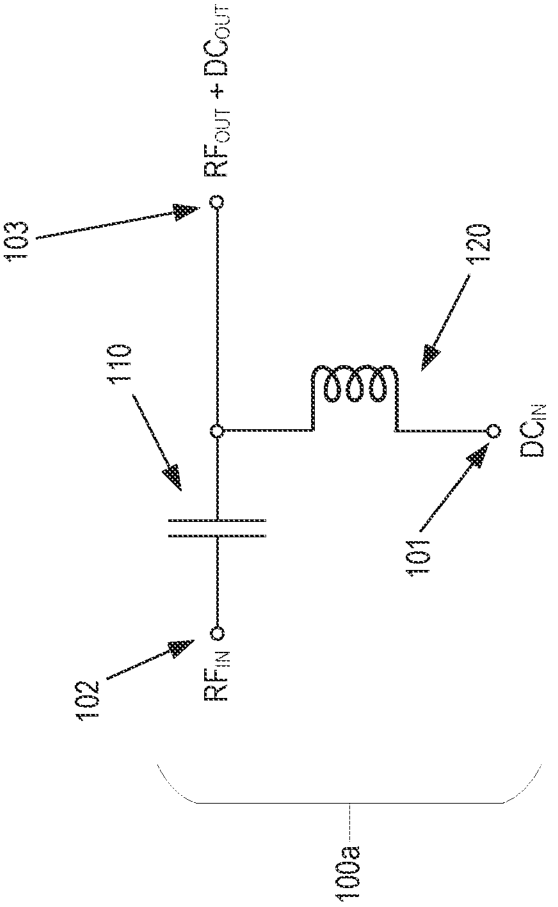
FIG. 1 (PRIOR ART)
FIG. 1 is a circuit diagram of a bias tee.
Figure 2:
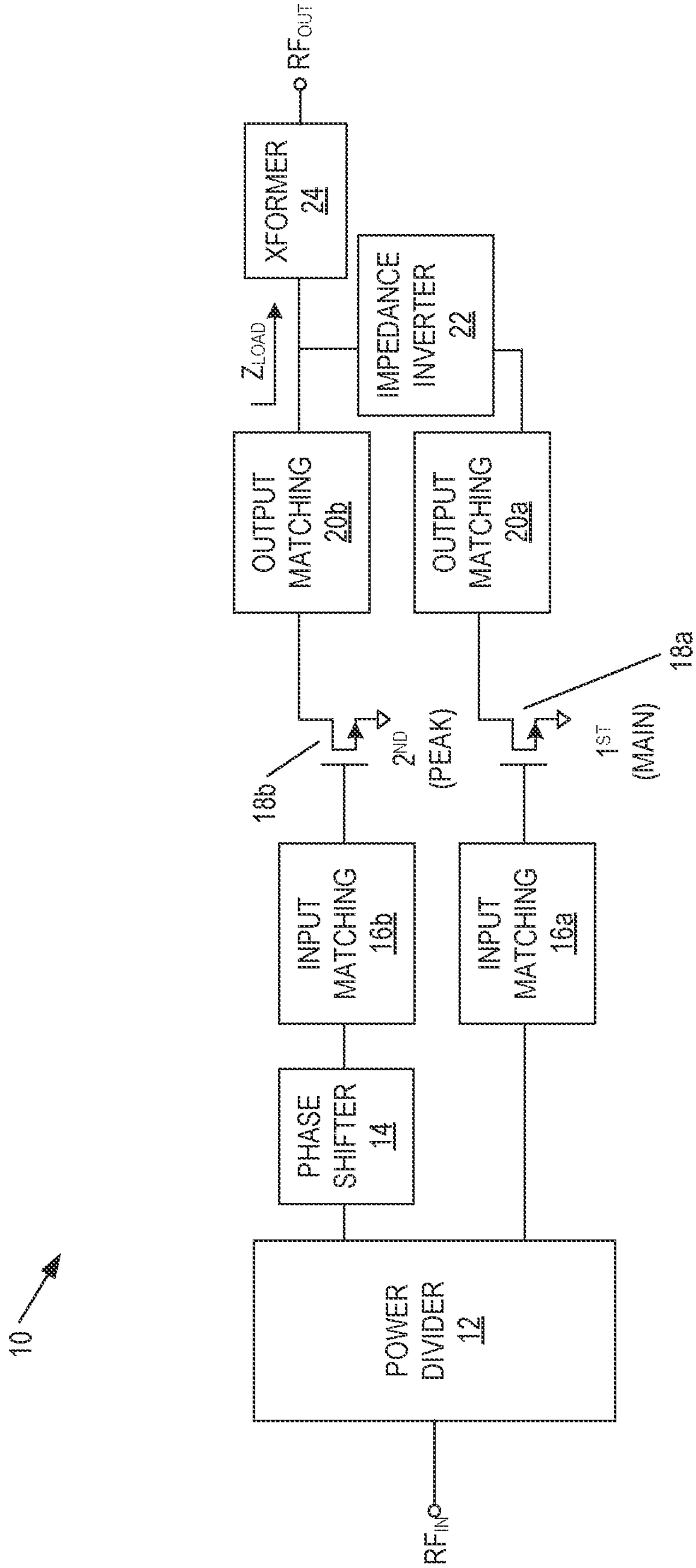
FIG. 2 (PRIOR ART)
FIG. 2 is a circuit diagram of a Doherty amplifier.
Figure 3:
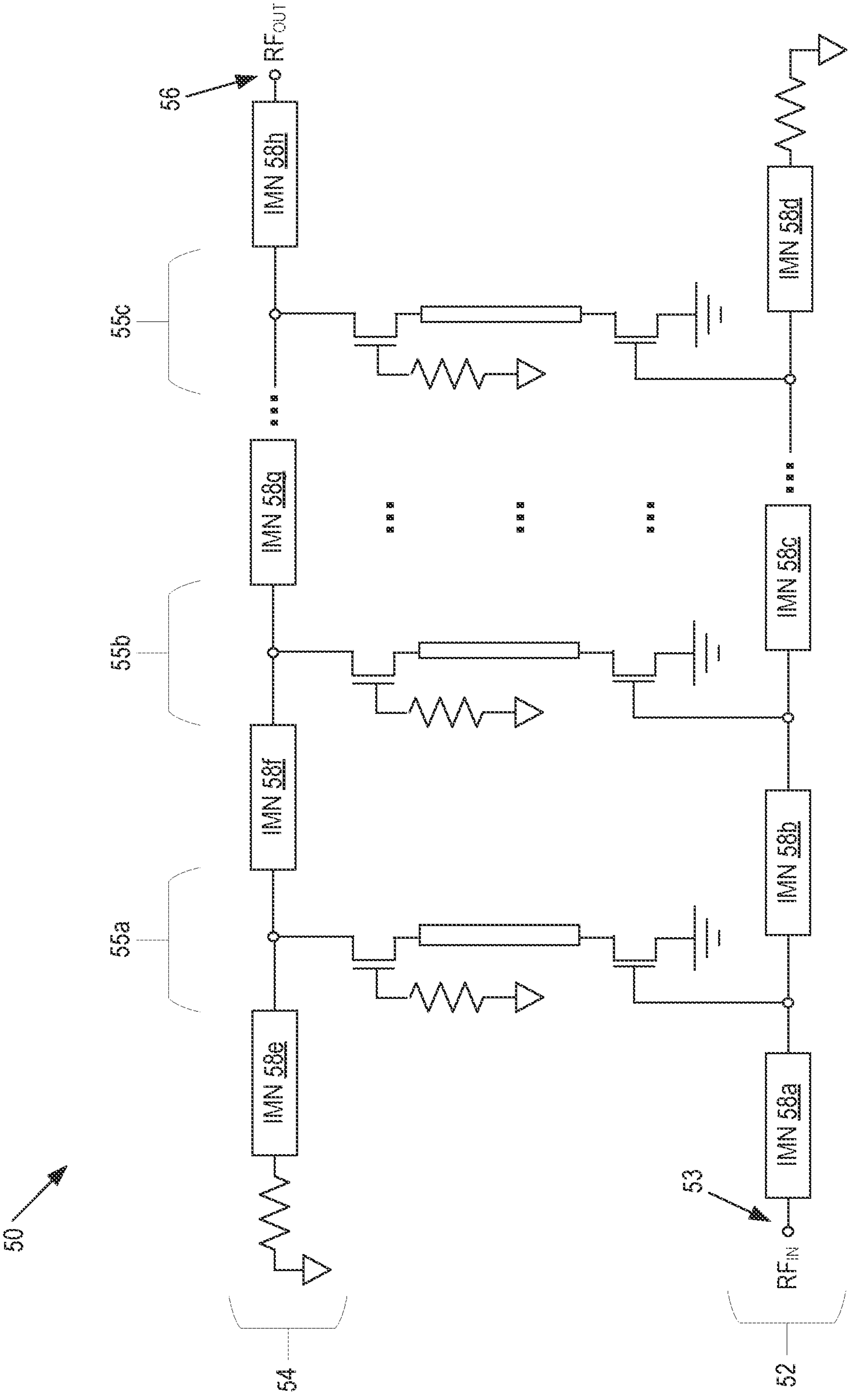
FIG. 3 (PRIOR ART)
FIG. 3 is a circuit diagram of a distributed amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Disclosed herein are an inductor 120 and a capacitor 110 that have enhanced thermal management features. The inductor 120 and the capacitor 110 are independently usable or may be used in combination with each other (e.g., in a bias tee 100).

Figure 4:
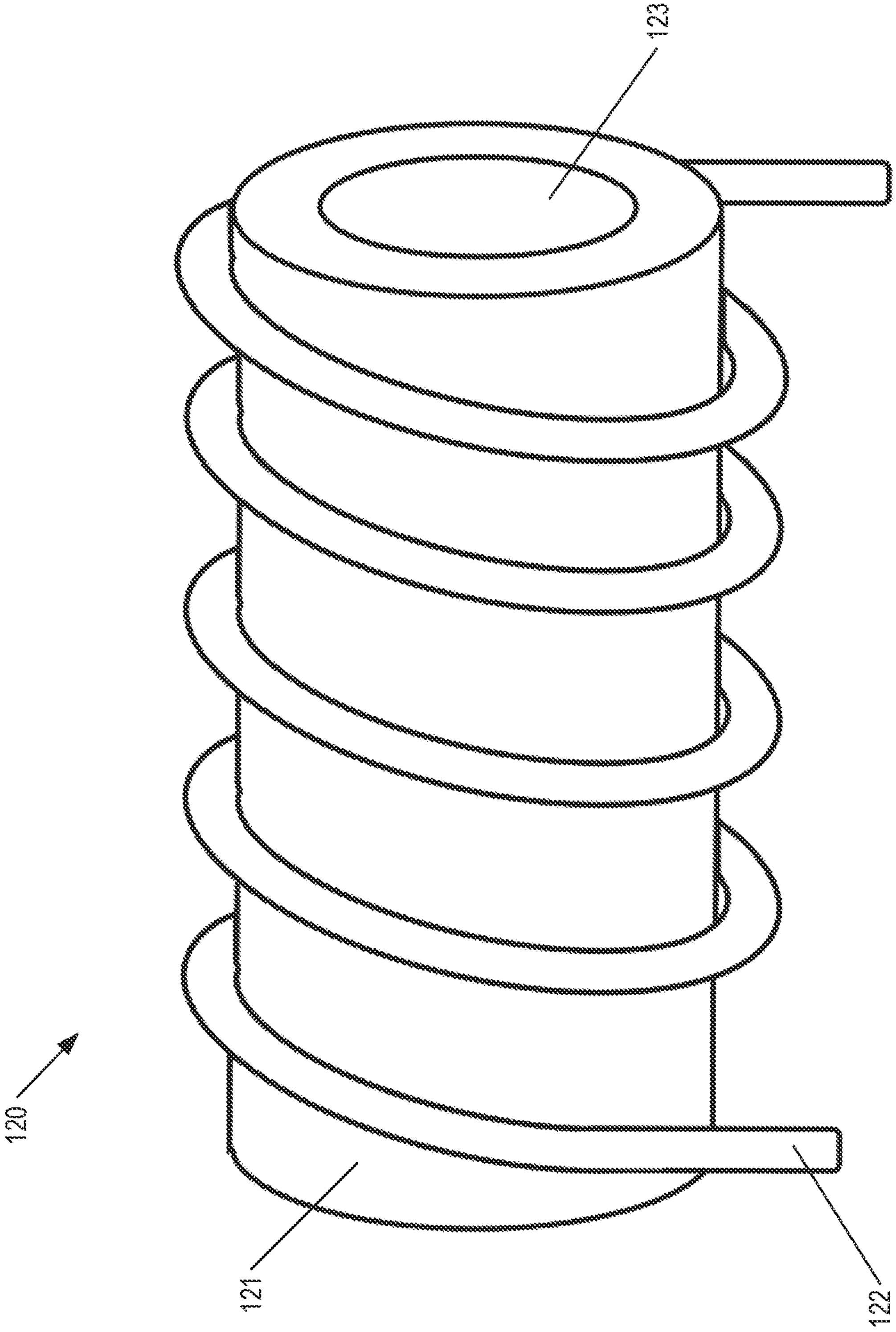
FIG. 4 is a schematic diagram of an example inductor according to one or more embodiments of the present disclosure.

FIG. 4 schematically illustrates an example inductor 120 according to one or more embodiments of the present disclosure. The inductor 120 comprises a ferrite core 121 and an electrically conductive wire 122. In this example, the ferrite core 121 is rod-shaped, though other shapes may used instead (e.g., a cone, a truncated cone, a torus). Additionally or alternatively, other examples of the inductor 120 may include a core 121 comprising one or more other materials. In one particular example, the core 121 may predominantly comprise ferrite interspersed with aluminum nitride particles.

The wire 122 is wrapped around the ferrite core 121. When electrical current flows through the wire 122, a magnetic field is generated that can be used to store the electrical energy. When the electrical current stops, the energy stored in the magnetic field generates electrical current.

In this way, the overall operation of the inductor 120 resists changes to the electrical current on the wire 122 which may provide one or more advantages. For example, the inductor may help to reduce the effects of stray currents and clean up an irregular or noisy signal. The inductor in this example is made of ferrite, though other materials having a relatively high dielectric constant may additionally or alternatively be used. The high dielectric constant of the ferrite core 121 improves the strength of the magnetic field generated by the current through the wire 122.

That said, the use of a ferrite in the inductor 120 may generate undesired heat, particularly in high performance applications such as RF. Accordingly, various embodiments discussed herein abate the negative impact of heat on the performance and resiliency of electrical components. Further, particular embodiments enable higher power handling in a smaller space relative to traditional approaches.

Figure 5:
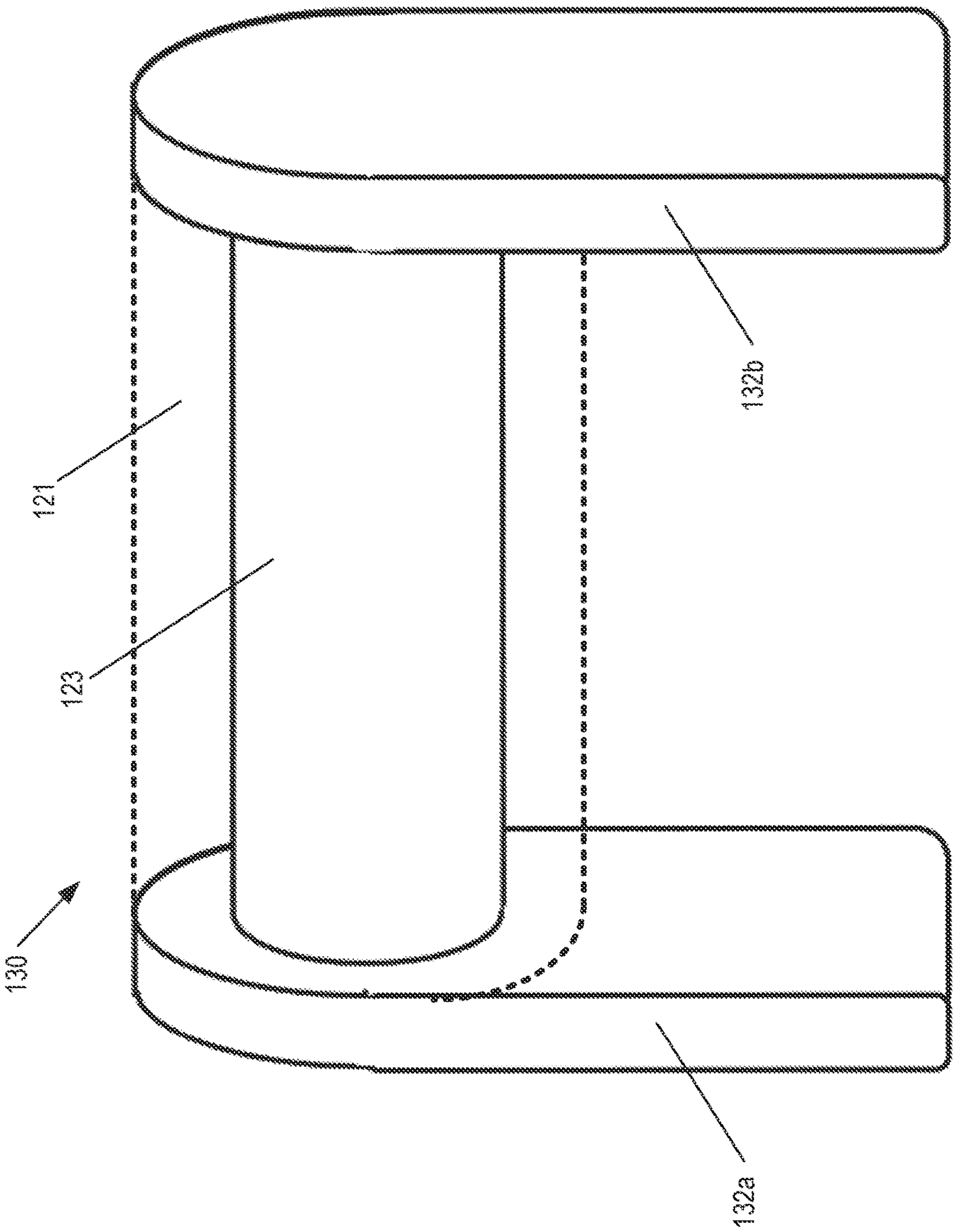
FIG. 5 is a schematic diagram of an example heat transfer structure according to one or more embodiments of the present disclosure.

An example design feature for thermal management shown in FIG. 4 includes the ferrite core 121 being hollow and a thermally conductive, electrically insulating element 123 extending through the ferrite core 121. The element 123 is part of a thermally conductive heat transfer structure that is operative to transfer heat away from the ferrite core 121. FIG. 5 illustrates an example of such a heat transfer structure 130. The example heat transfer structure 130 of FIG. 5 comprises the thermally conductive, electrically insulating element 123 as well as first and second support structures 132*a*, 132*b*. As noted above, the element 123 passes through the ferrite core 121 (depicted in FIG. 5 for reference in dashed lines). In this example, the element 123 extends coaxially and adjacently through the core 121. In addition to contacting the core 121, the element 123 contacts each of the support structures 132*a*, 132*b* at a respective end of the element 123, thereby enabling heat to be transferred away from the core 121 by thermal conduction through the element 123 and to the support structures 132*a*, 132*b*.

Figure 6A:
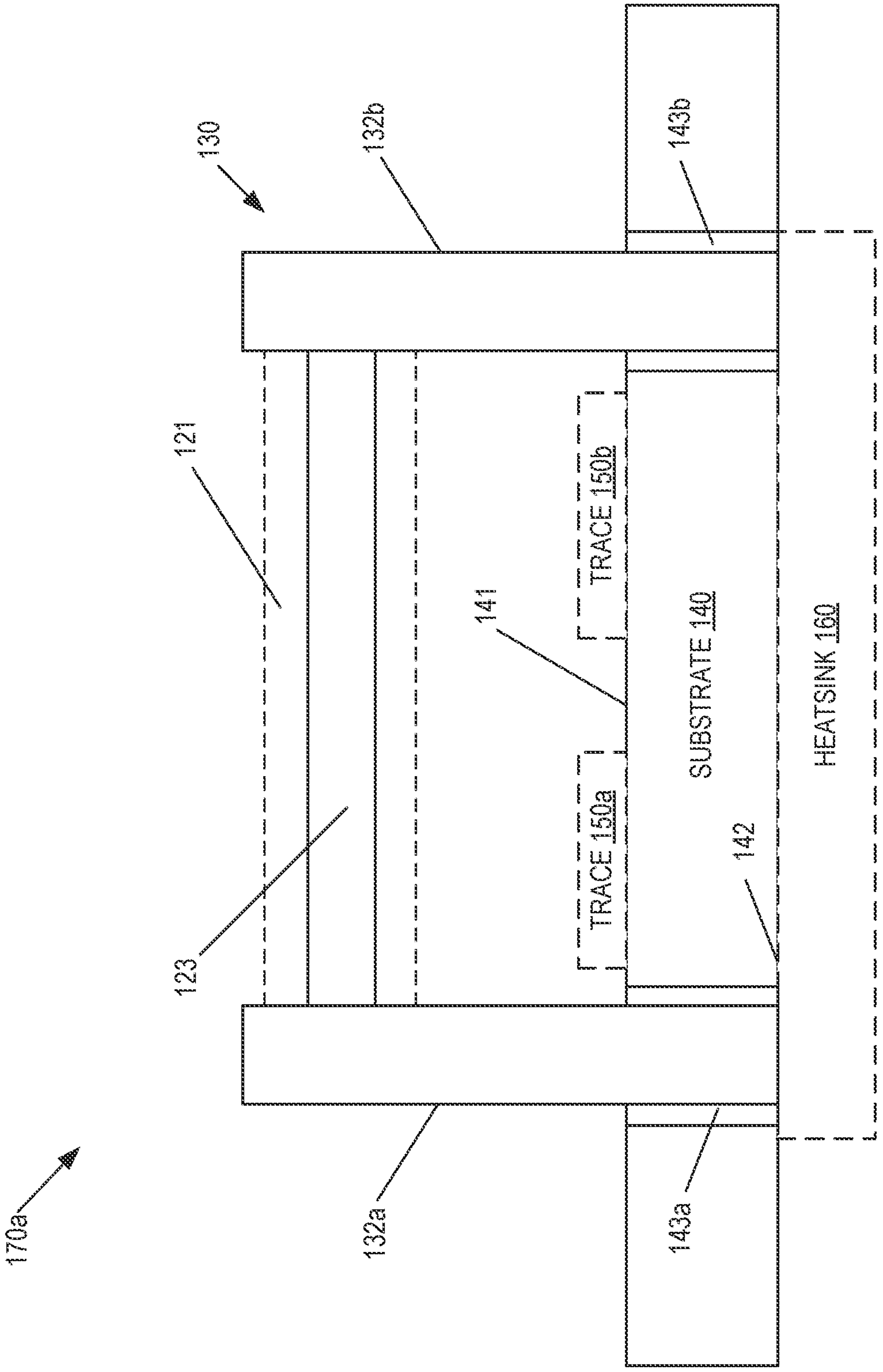
FIG. 6A, FIG. 6B, and FIG. 6C are schematic block diagrams illustrating examples of an electronics arrangement comprising an inductor according to one or more embodiments of the present disclosure.

The support structures 132*a*, 132*b* may be used to support the inductor 120 relative to a substrate 140, as shown by the example electronics arrangement 170*a* of FIG. 6A. In the example of FIG. 6A, the support structures 132*a*, 132*b* support the inductor 120 such that the ferrite core 121 is spaced above a top side 141 of the substrate 140 with the core 121 extending predominantly parallel to the substrate 140. Spacing the inductor 120 away from the substrate 140 may be advantageous, e.g., to reduce parasitic capacitance.

As will be shown in subsequent figures, the wire 122 of the inductor 120 may be bonded to traces 150*a*, 150*b* disposed on the top side 141 of the substrate 140 to electrically connect the inductor 120 to other electrical components. For example, a trace 150*a* may be connected to a DC source, and trace 150*b* may be connected to an output, e.g., of a bias tee 100.

In this example, the support structures 132*a*, 132*b* extend through respective openings 143*a*, 143*b* in the substrate 140. That said, in other embodiments, a single opening 143 in the substrate 140 may accommodate two or more support structures 132. The support structures 143*a*, 143*b* may be in contact with (e.g., mounted to) a heatsink 160 disposed below a bottom side 142 of the substrate 140 (e.g., adjacently). By contact between the support structures 143*a*, 143*b* and the heatsink 160, heat may be transferred away from the inductor 120 above the substrate 140 to the heatsink 160 below the substrate 140. The heat, once transferred to the heatsink 160, may be radiated into the ambient air or a supplied coolant (e.g., water) as appropriate. That said, irrespective of whether or not the heatsink 160 is present, embodiments of the present disclosure are effective to transfer heat from one side 141 of the substrate 140 to the opposite side 142 through an opening in the substrate 140.

Figure 6B:
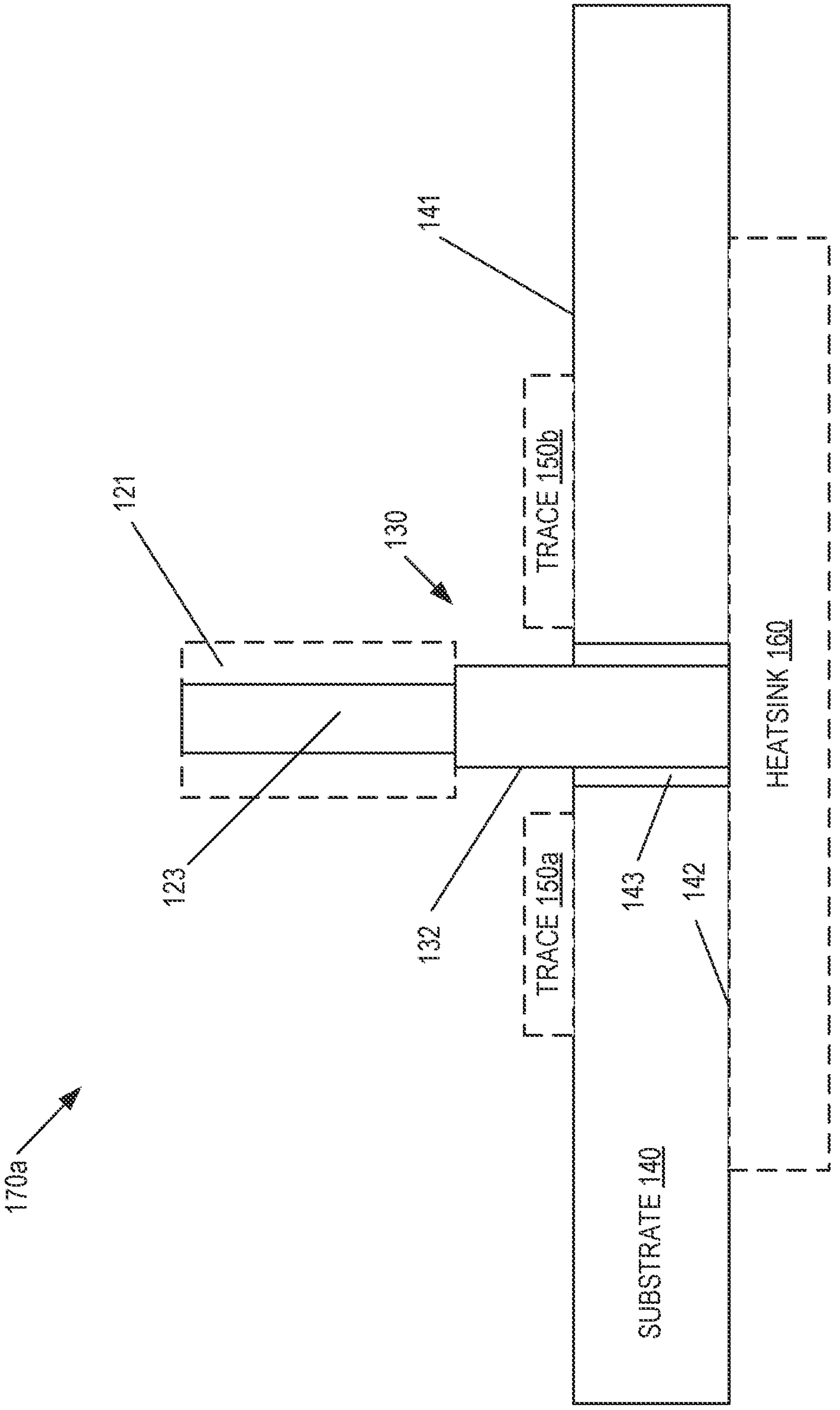

The electronics arrangement 170*a* may vary in certain respects, depending on the embodiment. In the example of FIG. 6B, the heat transfer structure 130 includes a single support structure 132 and supports the inductor 120 above the top side 141 of the substrate 140 such that the core 121 extends predominantly perpendicular to the substate 140. It will thus be appreciated that the heat transfer structure 130 may include any number of support structures 143 and may support the inductor 120 in any orientation, according to particular embodiments. Notwithstanding, the heat transfer structure 130 is effective to transfer heat away from the inductor 120, e.g., to the other side 142 of the substrate 140, to a heatsink 160, or to other locations where the heat can be better managed.

For example, the element 123 may comprise, or may be part of, a heat pipe in contact with the core 121. Heat absorbed by the heat pipe from the core 121 may evaporate a liquid within the heat pipe into a vapor that travels along the heat pipe through a support structure 132 and towards the heatsink 160. At the heatsink 160, the vapor may condense back into a liquid, releasing heat on the side of the substrate 140 opposite the substrate 140 (or other desirable location). The liquid may then be returned into the element 123 to further cool the core 121. The liquid may return to the element 123 by any available mechanism, e.g., by capillary action, by gravity, or by being pumped, depending on the embodiment.

Figure 6C:
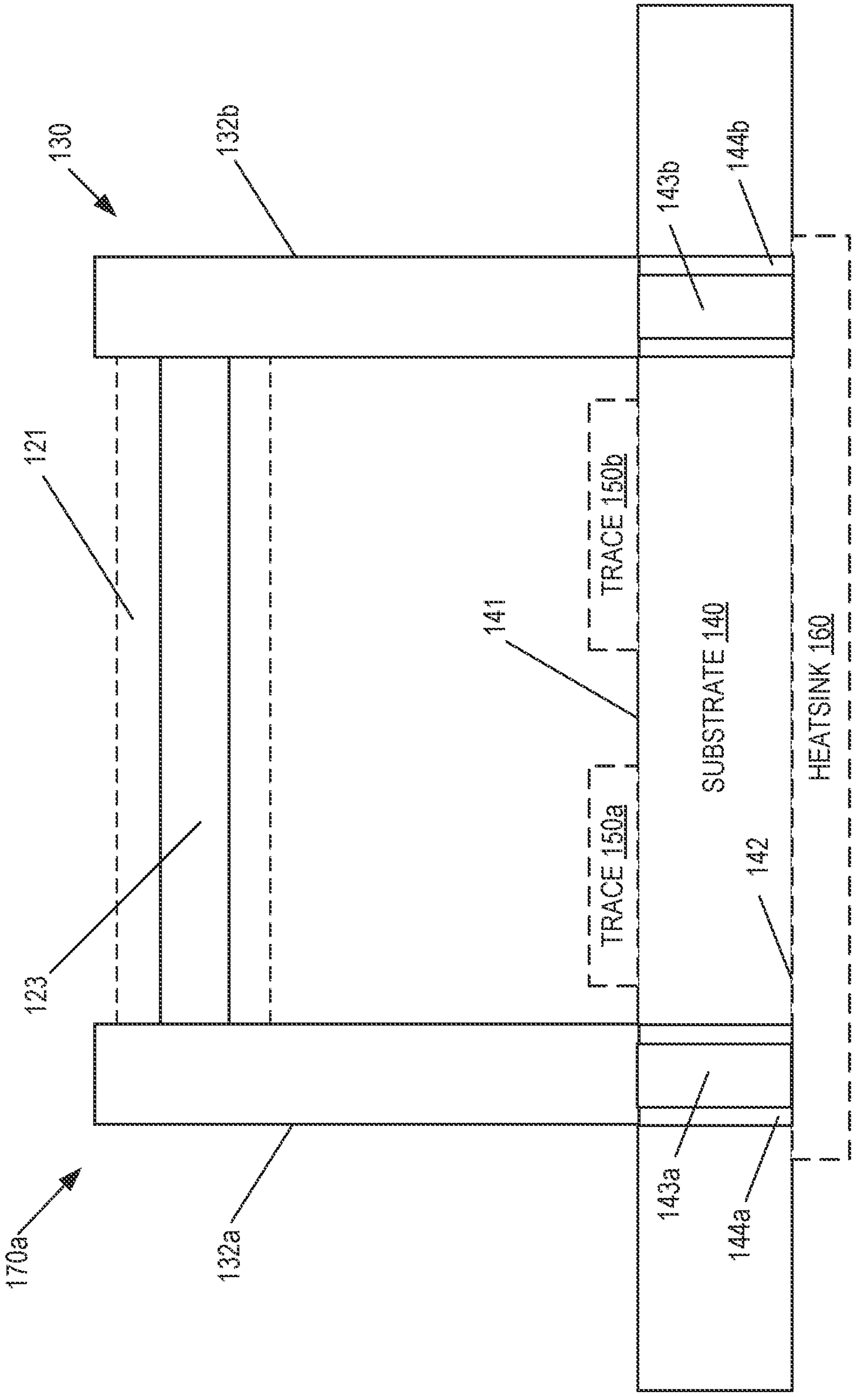

Another example embodiment of the electronics arrangement 170*a* is illustrated in FIG. 6C. As shown in FIG. 6C, the substrate 140 may comprise one or more thermal vias 144. In this example, the heat transfer structure 130 is mounted to the substrate 140 such that each of the support structures 132*a-b* is in contact with one or more thermal vias 144*a*, 144*b*. Each thermal via 144*a-b* comprises a heat conductive material extending from the top side 141 of the substrate 140 to the bottom side 142 of the substrate 140. At the bottom side of the substrate 140, each thermal via 144*a-b* may contact a heatsink 160 (e.g., a copper metallization layer). In some further embodiments, the opening of one or more of the thermal vias 144 may be filled with a conductive fill such as MICROMAX CB100 or TATSUTA AE3030.

The heatsink 160 may be of any suitable design or type. In some embodiments, the heatsink 160 is a passive heatsink that does not rely on forced air to provide heat abatement effects. In other embodiments, the heatsink 160 is an active heatsink that uses an air circulation device (e.g., a fan, a blower) to improve heat abatement characteristics. In some embodiments, the heatsink 160 comprises a metallization layer contacting the substrate 140. In other embodiments, the heatsink 160 comprises a coolant pump that circulates coolant into a cold plate attached to the heat transfer structure 130 and/or the substrate 140.

The heat transfer structure 130 may include any one or more thermally conductive materials such as copper, alumina, aluminum nitride, beryllium oxide, diamond, and hexagonal boron nitride. In one example, the heat transfer structure 130 comprises a thermally conductive material having a thermal conductivity of more than 28 W/mK. Additionally or alternatively, the heat transfer structure 130 may comprise a thermally conductive material having a thermal conductivity of more than 140 W/mK. In some particular embodiments, the heat transfer structure 130 may comprise a thermally conductive material having a thermal conductivity of more than 300 W/mK.

Also, as previously mentioned, the heat transfer structure 130 is electrically insulating. In one example, the heat transfer structure 130 comprises an electrically insulating material having a dielectric constant of less than 10.2 F/m. Additionally or alternatively, the heat transfer structure 130 may comprise an electrically insulating material having a dielectric constant of less than 9.25 F/m. In some particular embodiments, the heat transfer structure 130 may comprise an electrically insulating material having a dielectric constant of less than 7 F/m.

In some embodiments, different parts of the heat transfer structure 130 comprise different materials, e.g., in order to balance performance and cost concerns. In this regard, the element 123 may comprise aluminum nitride or beryllium oxide so that a material having a relatively high thermal conductivity is placed in direct contact with the core 121. In contrast, the support structures 132*a*, 132*b* may comprise copper so that parts of the heat transfer structure 130 that are farther away from the core 121 comprise a relatively low cost material. Other embodiments may comprise other combinations of materials in order to balance these or other practical concerns.

Figure 7A:
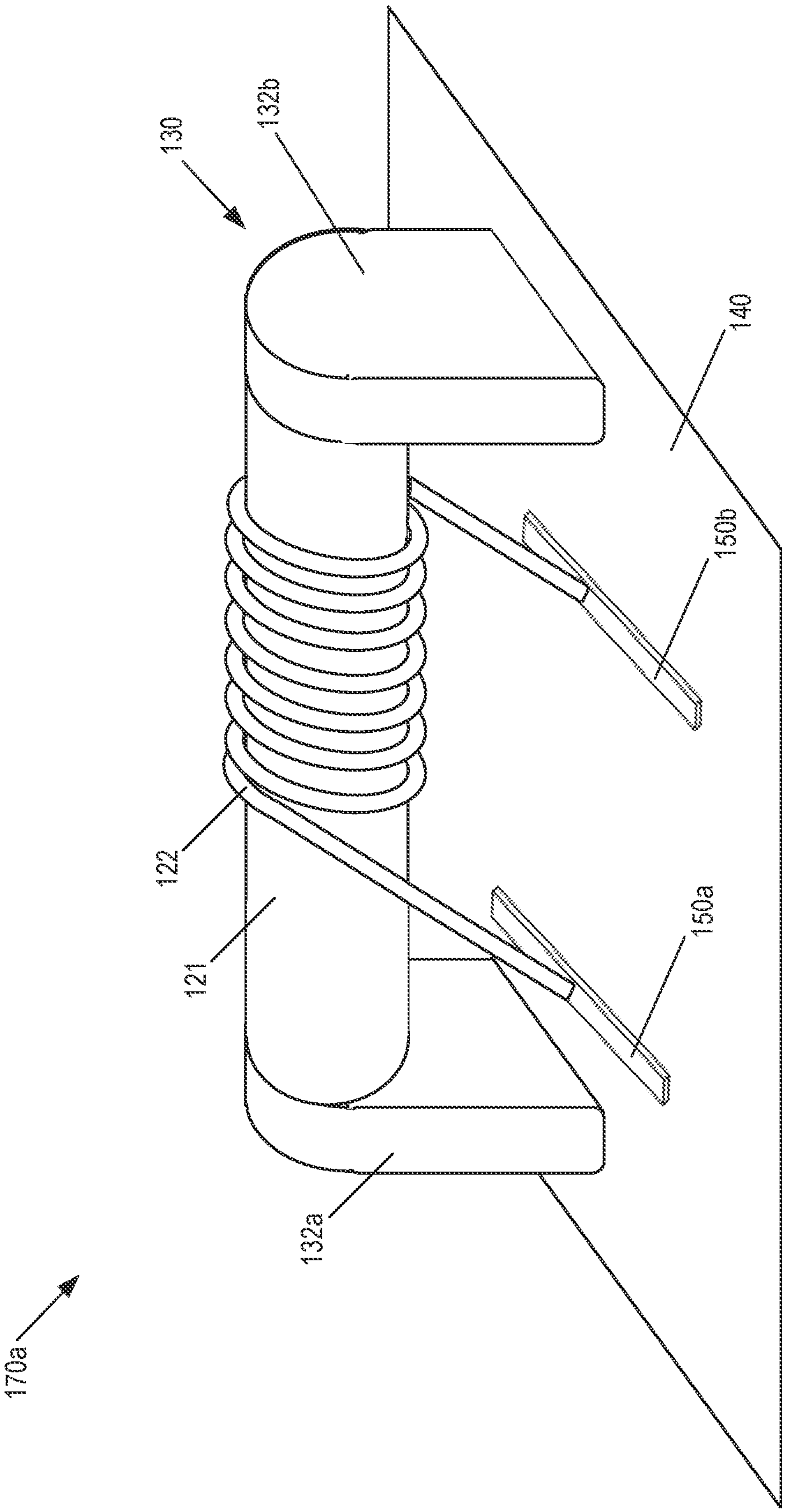
FIG. 7A and FIG. 7B are schematic diagrams illustrating examples of an inductor bonded to traces on a substrate according to one or more embodiments of the present disclosure.
Figure 7B:
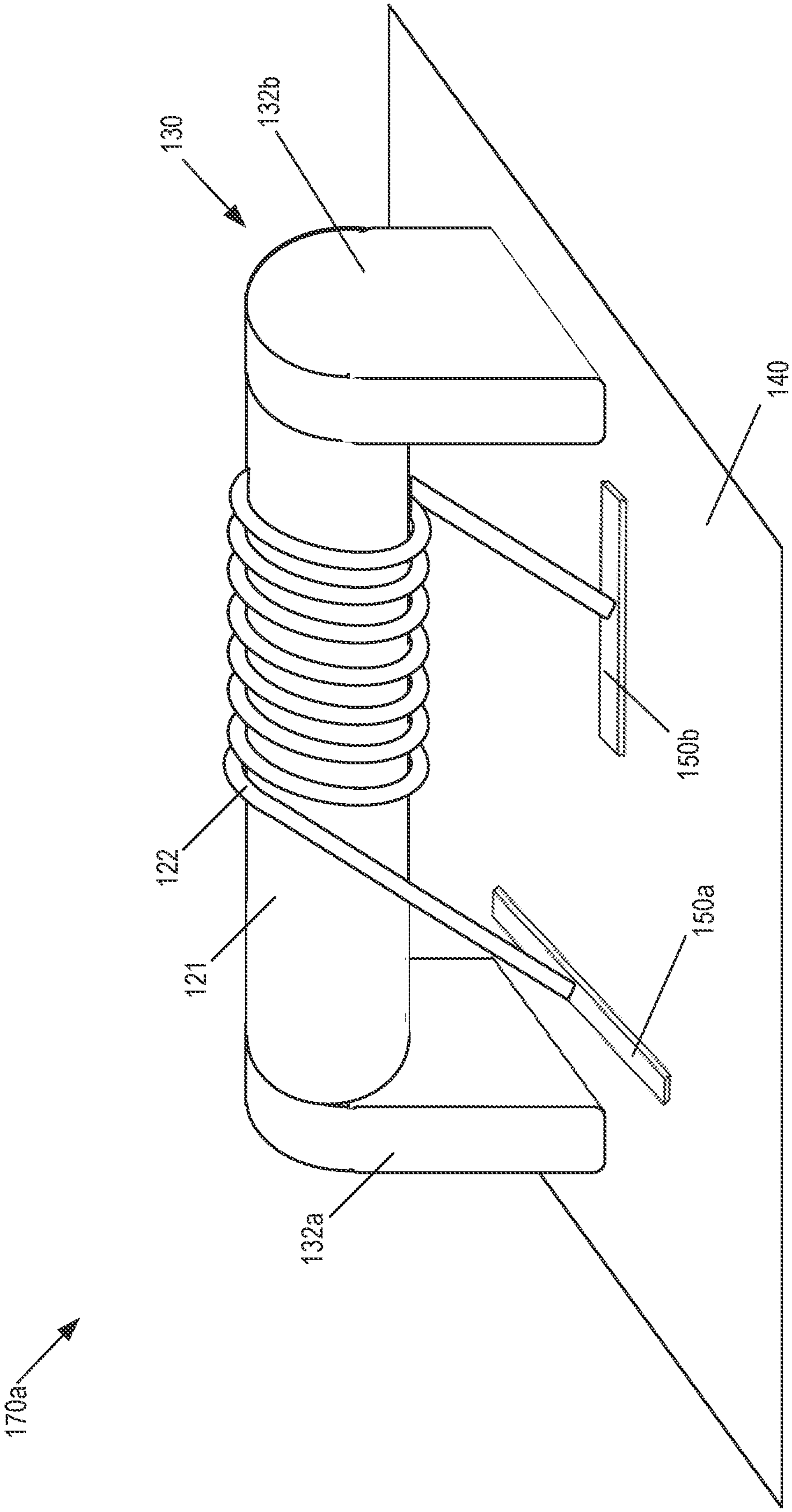

The traces 150*a*, 150*b* may be oriented in different ways depending on the embodiment. In the example of FIG. 7A, the traces 150*a*, 150*b* run predominantly parallel to each other. In the example of FIG. 7B, the traces 150*a*, 150*b* run predominantly perpendicular to each other. The relative orientation of the traces 150*a*, 150*b* may differ in order to ensure that line noise, signal reflections, and other design constraints are adhered to.

Although the examples depicted in FIG. 7A and FIG. 7B show the traces 150*a*, 150*b* disposed between the support structures 132*a*, 132*b*, according to other embodiments, one or both of the traces 150*a*, 150*b* may be disposed at other locations on the substrate 140, e.g., outside of an area projected by the inductor 120 upon the substrate 140. For example, a trace 150*a*, 150*b* may be disposed on an opposite side of one of the support structures 132*a*, 132*b* (e.g., such that both of the support structures 132*a*, 132*b* are in a same direction away from the trace 150*a*, 150*b*).

Figure 8A:
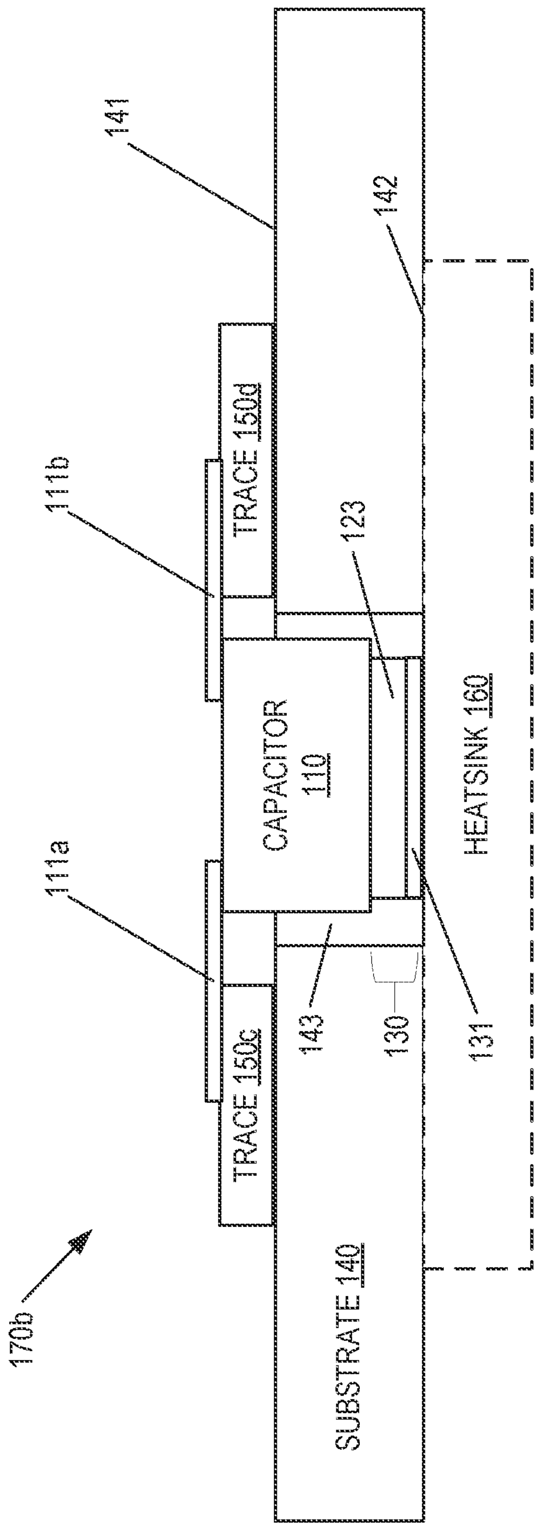
FIG. 8A and FIG. 8B are schematic diagrams illustrating examples of an electronics arrangement comprising a capacitor according to one or more embodiments of the present disclosure.

As noted above, other embodiments include a capacitor 110 that may be used independently from, or in conjunction with, the inductor 120. An example of an electronics arrangement 170*b* comprising a capacitor 110 according to embodiments of the present disclosure is illustrated in FIG. 8A. The capacitor 110 is positioned in an opening 143 in the substrate 140. The capacitor 110 is electrically connected to traces 150*c*, 150*d* disposed on the top side 141 of the substrate 140 via respective connectors 111*a*, 111*b*. The connectors 111*a*, 111*b* may be electrically conductive tabs or leads, for example. The traces 150*c*, 150*d* may be electrically connected to other electronics on or off the substrate. For example, a trace 150*c* may be connected to an RF source, and trace 150*d* may be connected to an output, e.g., of a bias tee 100.

The electronics arrangement 170*b* may further comprise a heat transfer structure 130 positioned at least partly within the opening 143. The heat transfer structure 130 is operative to transfer heat away from the capacitor 110 and toward the bottom side 142 of the substrate. In this regard, the heat transfer structure 130 may comprise a thermally conductive, electrically insulating element 123 adjacent to the capacitor. The heat transfer structure 130 may additionally or alternatively comprise a metallization layer 131. The heat transfer structure 130 may be adjacent to a heatsink 160 below the bottom side 142 of the substrate 140 (e.g., adjacently). In this regard, the metallization layer 131 may facilitate bonding to the heatsink 160, e.g., using an epoxy or solder.

Figure 8B:
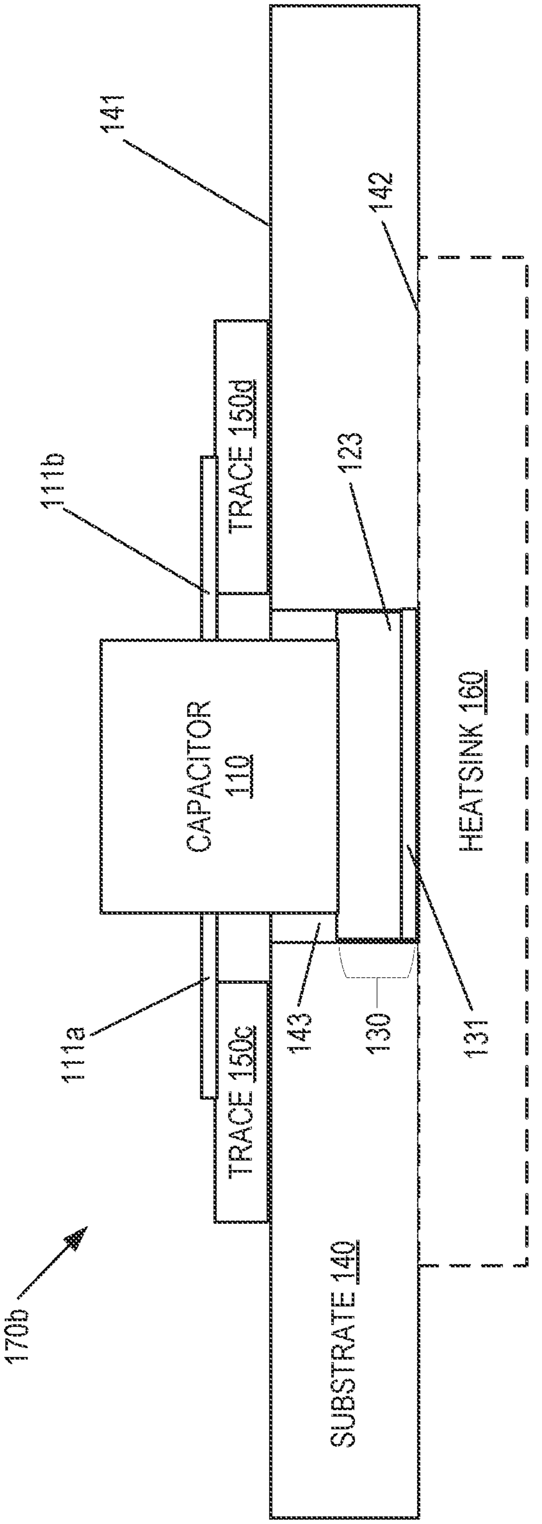

The capacitor may be mounted in a variety of ways depending on the embodiment. FIG. 8B schematically illustrates another example of the electronics arrangement 170*b* in which a heat transfer structure 130 is operative to transfer heat away from a capacitor 110 and towards a bottom side 142 of the substrate 140. In the example of FIG. 8B, the connector is positioned higher within the opening 143 and a thicker heat transfer structure 130 is used to transfer heat from the capacitor 110 toward the bottom side 142 of the substrate 140.

In view of the above, a first example electronics arrangement 170*a* according to embodiments of the present disclosure comprises an electrically insulating substrate 140 comprising a top side 141 and a bottom side 142. The electronics arrangement 170*a* further comprises an inductor 120 comprising a ferrite core 121 above the substrate 140 and an electrically conductive wire 122 wound around the ferrite core 121. The electronics arrangement 170*a* further comprises a thermally conductive heat transfer structure 130 operative to transfer heat away from the ferrite core 121. The heat transfer structure 130 comprises a thermally conductive electrically insulating element 123 passing through the ferrite core 121.

A second example electronics arrangement 170*b* comprises an electrically insulating substrate 140 comprising a top side 141 and a bottom side 142. The electronics arrangement 170*b* further comprises a capacitor 110 positioned within an opening 143 in the substrate 140. The electronics arrangement 170*b* further comprises a thermally conductive heat transfer structure 130 operative to transfer heat away from the capacitor 110 and toward the bottom side 142 of the substrate 140. The heat transfer structure 130 comprises a thermally conductive electrically insulating element 123 adjacent to the capacitor 110.

Figure 9:
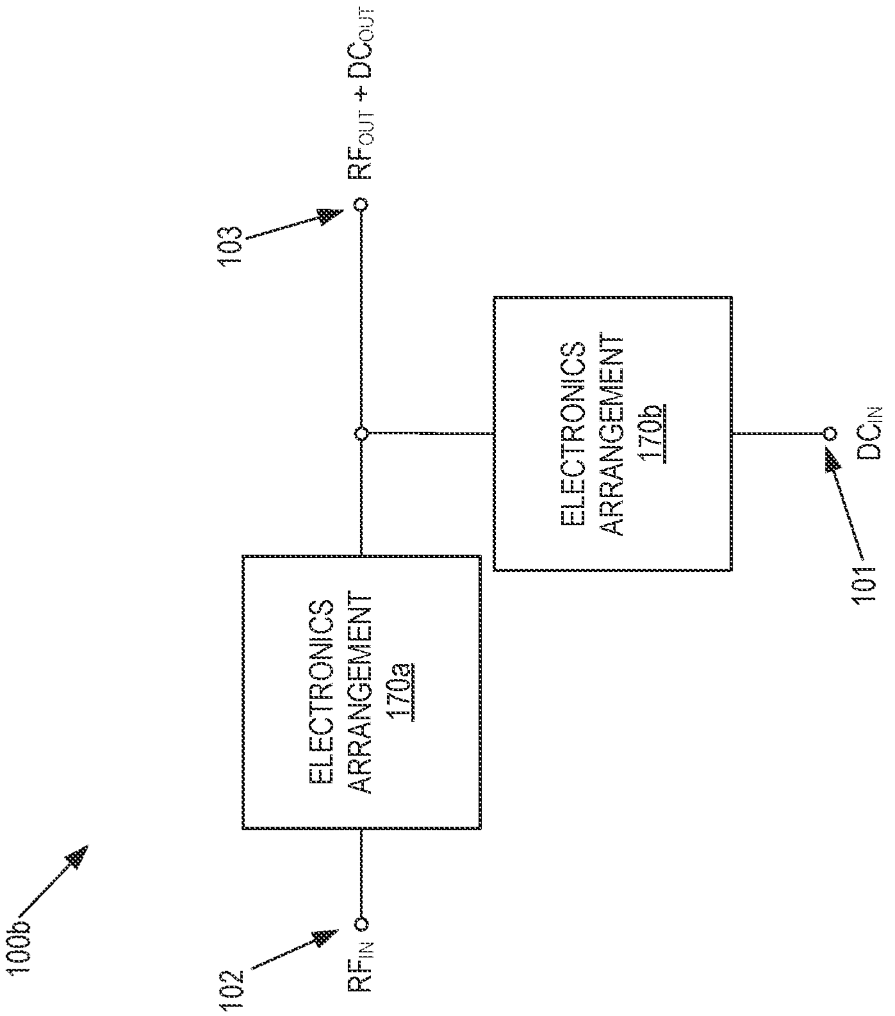
FIG. 9 is a circuit diagram illustrating an example of a bias tee according to one or more embodiments of the present disclosure.

Yet further embodiments of the present disclosure include a bias tee 100*b* comprising the electronics arrangement 170*a* and the electronics arrangement 170*b*, as shown in FIG. 9. The electronics arrangement 170*a* comprising the inductor 120 and the electronics arrangement 170*b* comprising the capacitor 110 are electrically connected. In some embodiments, the electronics arrangement 170*a* and the electronics arrangement 170*b* share components, such as the substrate 140 and/or the heatsink 160.

The bias tee 100*b* further comprises a first input port 101, a second input port 102, and an output port 103. The first input port 101 is connected to $RF_{IN}$. The second input port 102 is connected to $DC_{IN}$. The capacitor 110 and inductor 120 respectively pass $RF_{IN}$ and $DC_{IN}$ through to the output port 103 to provide a biased RF output ($RF_{OUT}$+$DC_{OUT}$). The capacitor 110 restricts $DC_{IN}$ from passing to the RF input port 102. Correspondingly, the inductor 120 restricts $RF_{IN}$ from passing to the DC input port 101.

Figure 10:
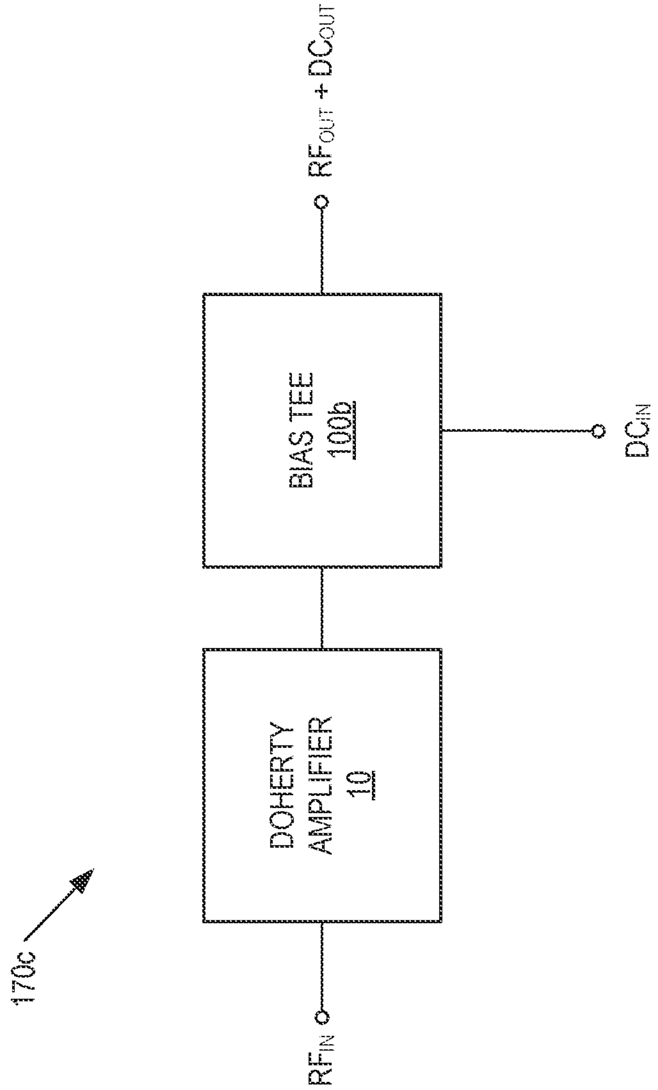
FIG. 10 is a circuit diagram illustrating an example of an electronics arrangement comprising a Doherty amplifier and a bias tee according to one or more embodiments of the present disclosure.

As shown in the example of FIG. 10, a Doherty amplifier 10 may be electrically connected to the bias tee 100*b* to form another example electronics arrangement 170*c*. In the electronics arrangement 170*c*, the bias tee 100*b* may be used to bias an RF signal that has been amplified by the Doherty amplifier 10 and provided to the RF input port 102 of the bias tee 100*b*. The Doherty amplifier 10 and the bias tee 100*b* may share a substrate 140.

Figure 11:
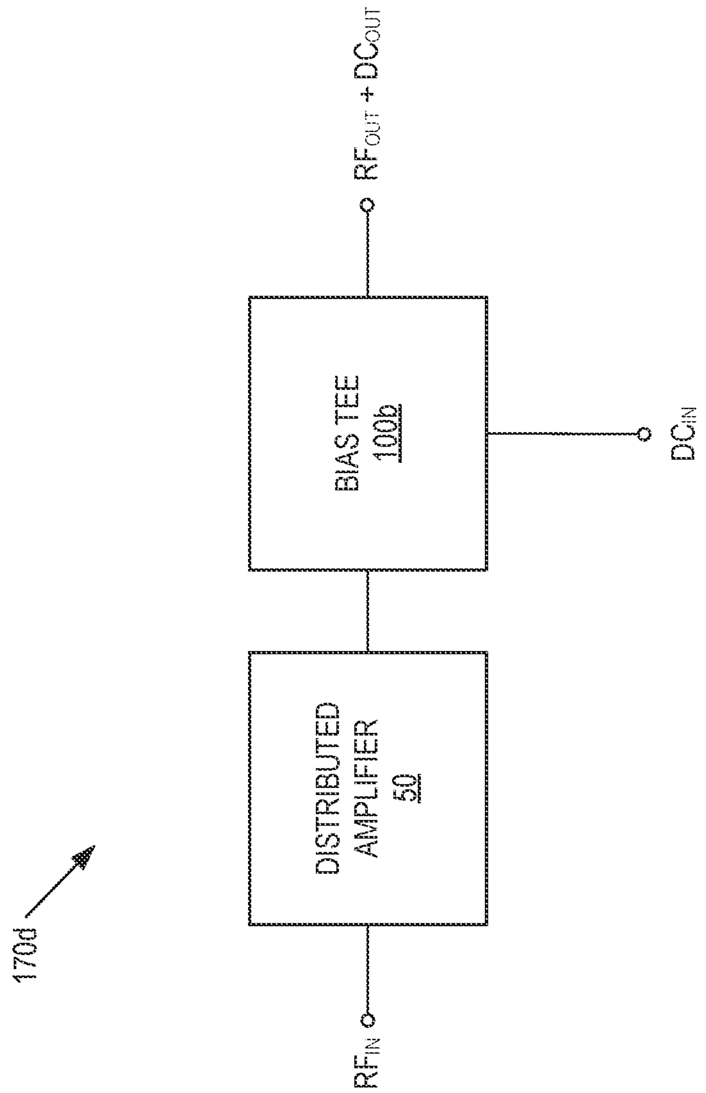
FIG. 11 is a circuit diagram illustrating an example of an electronics arrangement comprising a distributed amplifier and a bias tee according to one or more embodiments of the present disclosure.

Similarly, as shown in FIG. 11, a distributed amplifier 50 may be electrically connected to the bias tee 100*b* to form yet another example electronics arrangement 170*d*. In the electronics arrangement 170*d*, the bias tee 100*b* may be used to bias an RF signal that has been amplified by the distributed amplifier 50 and provided to the RF input port 102 of the bias tee 100*b*. The distributed amplifier 50 and the bias tee 100*b* may share a substrate 140.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:

1. An electronics arrangement comprising:

an electrically insulative substrate comprising a top side and a bottom side;

an inductor comprising a ferrite core above the substrate and an electrically conductive wire wound around the ferrite core; and a thermally conductive heat transfer structure operative to transfer heat away from the ferrite core, the heat transfer structure comprising (i) a thermally conductive, electrically insulating element passing through the ferrite core and (ii) a support structure coupled to the substrate and to the thermally conductive, electrically insulating element, wherein the support structure suspends the ferrite core above and a distance away from the substrate.

2. The electronics arrangement of claim 1, wherein the thermally conductive heat transfer structure comprises a thermally conductive material having a thermal conductivity of more than 28 W/mK.

3. The electronics arrangement of claim 1, wherein the thermally conductive heat transfer structure comprises a thermally conductive material having a thermal conductivity of more than 140 W/mK.

4. The electronics arrangement of claim 1, wherein the thermally conductive heat transfer structure comprises a thermally conductive material having a thermal conductivity of more than 300 W/mK.

5. The electronics arrangement of claim 1, wherein the thermally conductive heat transfer structure comprises an electrically insulative material having a dielectric constant of less than 10.2 F/m.

6. The electronics arrangement of claim 1, wherein the thermally conductive heat transfer structure comprises an electrically insulative material having a dielectric constant of less than 9.25 F/m.

7. The electronics arrangement of claim 1, wherein the thermally conductive heat transfer structure comprises an electrically insulative material having a dielectric constant of less than 7 F/m.

8. The electronics arrangement of claim 1, further comprising first and second traces on the top side of the substrate, each of the traces being bonded to a respective end of the wire.

9. The electronics arrangement of claim 1, further comprising a heatsink contacting the substrate.

10. The electronics arrangement of claim 1, wherein the element passes adjacently through the core in a direction that is predominantly parallel to the top and bottom sides of the substrate.

11. The electronics arrangement of claim 1, wherein the element passes adjacently through the core in a direction that is predominantly perpendicular to the top and bottom sides of the substrate.

12. The electronics arrangement of claim 1, wherein:

the structure extends through one or more openings in the substrate; and to transfer the heat away from the ferrite core, the thermally conductive heat transfer structure is operative to transfer the heat toward the bottom of the substrate through the one or more openings.

13. The electronics arrangement of claim 1, wherein the thermally conductive heat transfer structure comprises Alumina.

14. The electronics arrangement of claim 1, wherein the thermally conductive heat transfer structure comprises Aluminum Nitride.

15. The electronics arrangement of claim 1, wherein the thermally conductive heat transfer structure comprises Beryllium Oxide.

* * * * *